(12) United States Patent
Maba et al.

(10) Patent No.: US 6,393,089 B1
(45) Date of Patent: May 21, 2002

(54) FREQUENCY DIVIDER

(75) Inventors: Gustavo Maba; Ernest Knoll, both of Haifa (IL)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 09/671,284

(22) Filed: Sep. 27, 2000

(51) Int. Cl.[7] .............................................. H03K 21/00
(52) U.S. Cl. .......................................... 377/47; 377/48
(58) Field of Search ............................ 377/47, 48, 64, 377/72, 73; 327/115, 117

(56) References Cited

U.S. PATENT DOCUMENTS

| | | | | |
|---|---|---|---|---|
| 4,935,944 A | * | 6/1990 | Everett | 377/48 |
| 5,268,949 A | * | 12/1993 | Watanabe et al. | 377/33 |
| 6,009,139 A | * | 12/1999 | Austin et al. | 377/47 |
| 6,040,725 A | * | 3/2000 | Lee et al. | 327/175 |

* cited by examiner

Primary Examiner—Tuan T. Lam
(74) Attorney, Agent, or Firm—Antonelli, Terry, Stout & Kraus, LLP

(57) ABSTRACT

A frequency divider includes an output-and-control-signals generation circuit. The output-and-control-signals generation circuit outputs an output clock signal and a control signal responsive to an input clock signal and a state signal. A shift register, characterized by having a count-sequence length of $2^n-1$, outputs the state signal responsive to the output clock signal. A feedback loop is associated with the shift register. An exclusive or (XOR) gate, a multiplexer, and a plurality of flip-flops are disposed within the feedback loop. The multiplexer has a first input and a second input. A parallel-to-serial-input generation circuit is coupled to the output- and control-signals generation circuit and to the shift register, and receives the control signal. The first input of the multiplexer is coupled to the shift register and the second input of the multiplexer is coupled to the parallel-to-serial-input generation circuit.

18 Claims, 6 Drawing Sheets

FREQUENCY DIVIDER

BACKGROUND OF THE INVENTION

1. Field of the Invention

The invention relates generally to clock circuits, and more particularly to a frequency divider for a phase-locked loop (PLL) based clock generator circuit.

2. Description of the Related Art

A phase-locked loop (PLL) is a circuit which causes a particular system to track with another one. More precisely, a PLL is a circuit synchronizing an output signal (generated by an oscillator) with a reference or input signal in frequency as well as in phase. In the synchronized (often called locked) state, the phase error between the oscillator's output signal and the reference signal is zero, or remains constant.

If a phase error builds up, a control mechanism acts on the oscillator in such a way that the phase error is again reduced to a minimum. In such a control system the phase of the output signal is actually locked to the phase of the reference signal.

Obtaining the maximum performance or speed for the least amount of power is a goal in chip design. Typically, a clock is generated using a phase-locked loop and then distributed to various circuits on a chip. Not all circuits on a chip are driven by clocks at the same frequency. A significant improvement in system performance can be obtained by increasing the clock frequency that is input to certain circuits. Many circuits on a chip may require one clock frequency while other circuits may require a multiple of that clock frequency or a different clock frequency. There are often difficulties associated with generating a wide range of multiples of a clock frequency.

DETAILED DESCRIPTION

Figure 1:
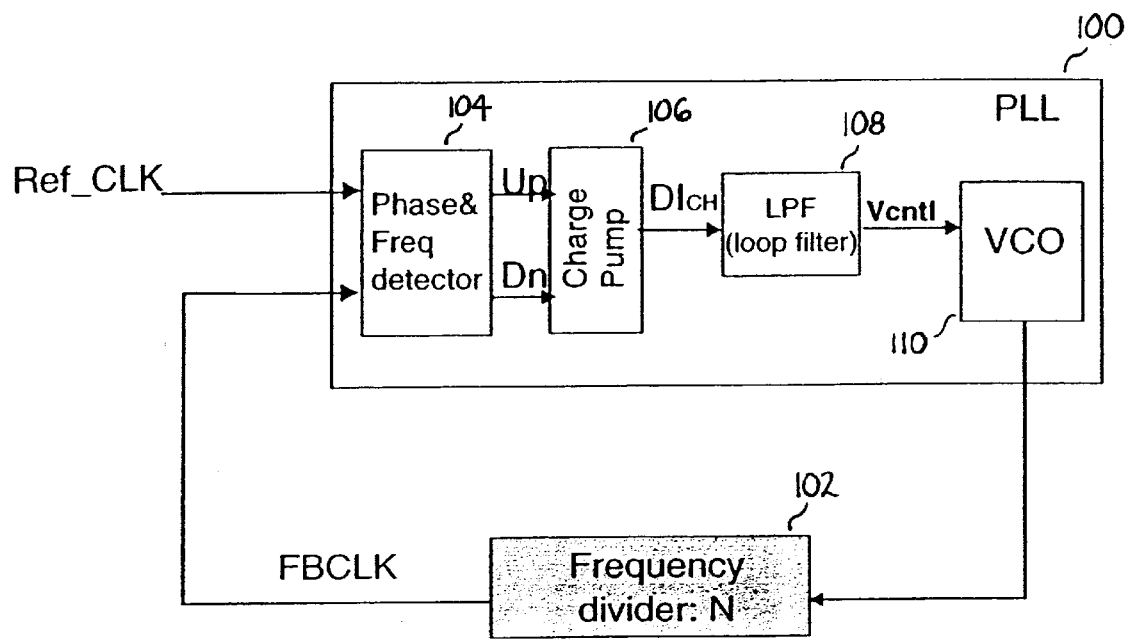
FIG. 1 illustrates an example clock generator which includes a phase-locked loop (PLL)

For a better understanding of the invention, together with other and further objects, advantages, and capabilities thereof, reference is made to the following disclosure and drawing figures. For clarity of explanation, the illustrative embodiments of the present invention are presented as comprising individual functional blocks. The functions these blocks represent may be provided through the use of either shared or dedicated hardware, including, but not limited to, hardware capable of executing software. For example, the functions of the blocks presented in the drawing figures may be provided by a single shared processor. Illustrative examples may comprise digital signal processor (DSP) hardware, read-only memory (ROM) for storing software performing the operations discussed below, and random-access memory (RAM) for storing DSP results. Very large scale integration (VLSI) hardware embodiments, as well as custom VLSI circuitry in combination with a general purpose DSP circuit, may also be provided.

Phase-locked loop based clock generators (or frequency synthesizers) use frequency dividers (e.g., counters) in a feedback loop. It is often difficult to generate a number of multiples of clock frequencies. In accordance with the principles of the invention, a frequency divider includes a signal generation circuit. The signal generation circuit outputs an output clock signal and a control signal responsive to an input clock signal and a state signal. A shift register, characterized by having a count-sequence length of $2^n-1$, outputs the state signal responsive to the output clock signal. A feedback loop is associated with the shift register. An exclusive or (XOR) gate, a multiplexer, and a plurality of flip-flops are disposed within the feedback loop. The multiplexer has a first input and a second input. A parallel-to-serial-input generation circuit is coupled to the signal generation circuit and to the shift register, and receives the control signal. The first input of the multiplexer is coupled to the shift register and the second input of the multiplexer is coupled to the parallel-to-serial-input generation circuit.

FIG. 1 illustrates an example clock generator, which includes a phase-locked loop (PLL). With reference to FIG. 1, the phase-locked loop (PLL) based clock generator includes a PLL 100. A frequency divider 102 is coupled to the PLL 100. The PLL 100 includes a phase and frequency detector 104. A charge pump 106 is coupled to the phase and frequency detector 104. A loop filter (LPF) 108 is coupled to the charge pump. A voltage-controlled oscillator (VCO) 110 is coupled to the LPF 108. The frequency divider 102 operates at the VCO frequency. Since the clock frequency increases with each new generation of microprocessors, the feedback counters in the frequency divider need to operate at higher and higher frequencies.

During the PLL frequency acquisition process, the VCO frequency may be greater than twice what the VCO frequency is during the normal operation (i.e., the nominal frequency). The feedback frequency divider (counter) must operate smoothly even at such higher frequencies.

Figure 2:
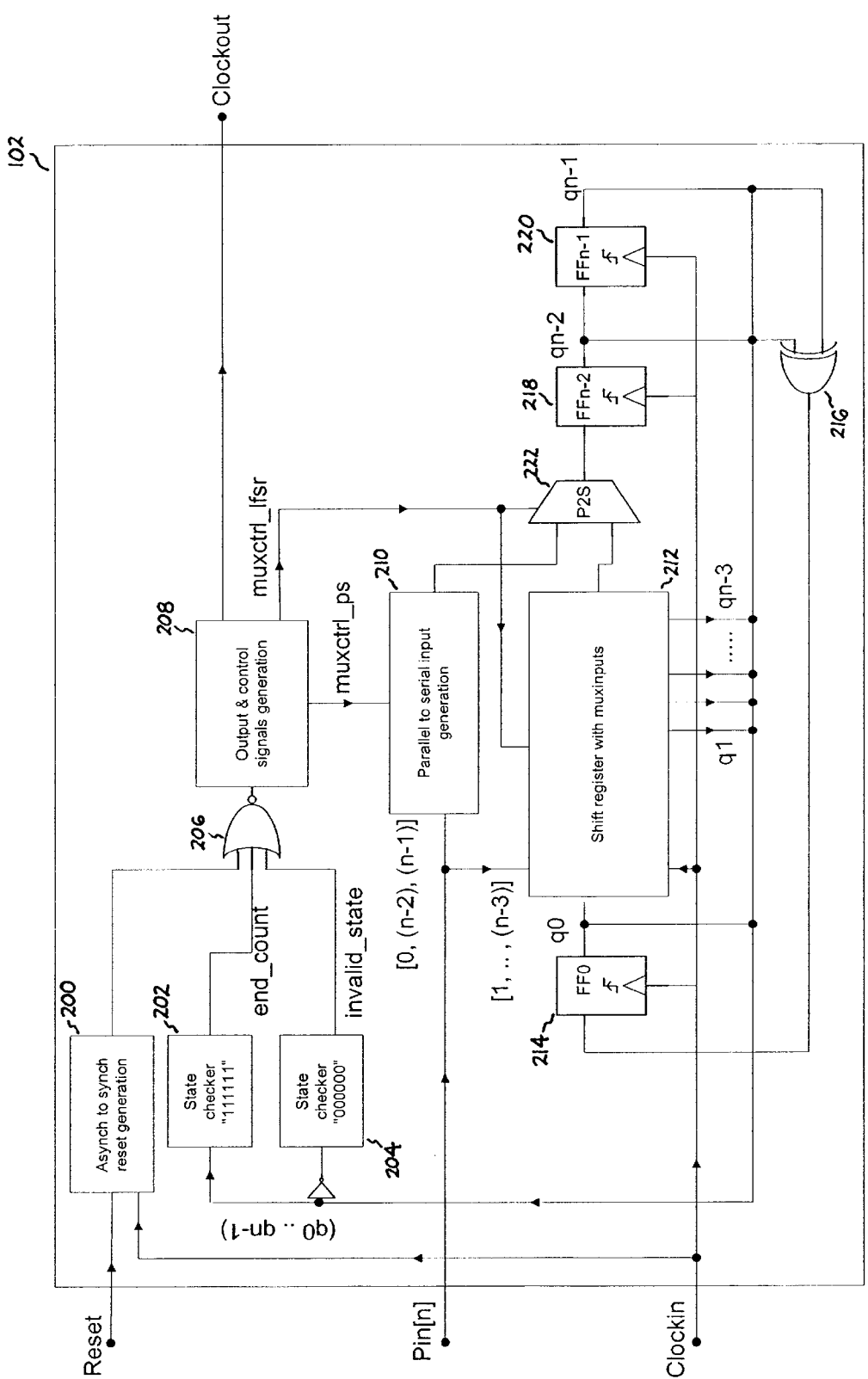
FIG. 2 illustrates an example n-bit frequency divider.

FIG. 2 illustrates a programmable frequency divider 102 for use in the system depicted in FIG. 1. With reference to FIG. 2, the frequency divider 102 includes an asynchronous-to-synchronous-reset generation circuit 200. A first state checker 202, a second state checker 204, and the asynchronous-to-synchronous reset generation circuit 200 are coupled to the three inputs of a NOR gate 206. An output-and-control-signals generation circuit 208 is coupled to the output of the NOR gate 206. A parallel-to-serial-input generation circuit 210 is coupled to the output-and-control-signals generation circuit 208. A shift register 212 with multiplexed inputs is coupled to the output-and-control-signals generation circuit 208 and flip-flop $FF_0$ (214) in a feedback loop. In the feedback loop, flip-flop $FF_0$ (214) is coupled to an exclusive or (XOR) gate 216; and flip-flop $FF_{n-2}$ (218) and flip-flop $FF_{n-1}$ (220) are coupled to the XOR gate 216. A multiplexer P2S (222) having two data inputs and a control input is coupled to the output of the parallel-to-serial-input generation circuit 210, and the output of the shift register 212. The output of the multiplexer P2S (222) is coupled to the flip-flop $FF_{n-2}$ (218).

The n-bit frequency divider depicted in FIG. 2 is capable of running with a fast synchronous clock at the input pin Clockin. The frequency divider uses the n-long shift register with both parallel to serial inputs that can count $2^n-1$ states. With the XOR gate 216 in the feedback loop, the counting sequence is neither binary nor any other known sequence. An advantage of such counting sequence is that the final state is known, and the "end of count" identification is simple to implement. The frequency divider also includes a self-reset mechanism to avoid noise errors and a synchronous generation reset.

Figure 3:
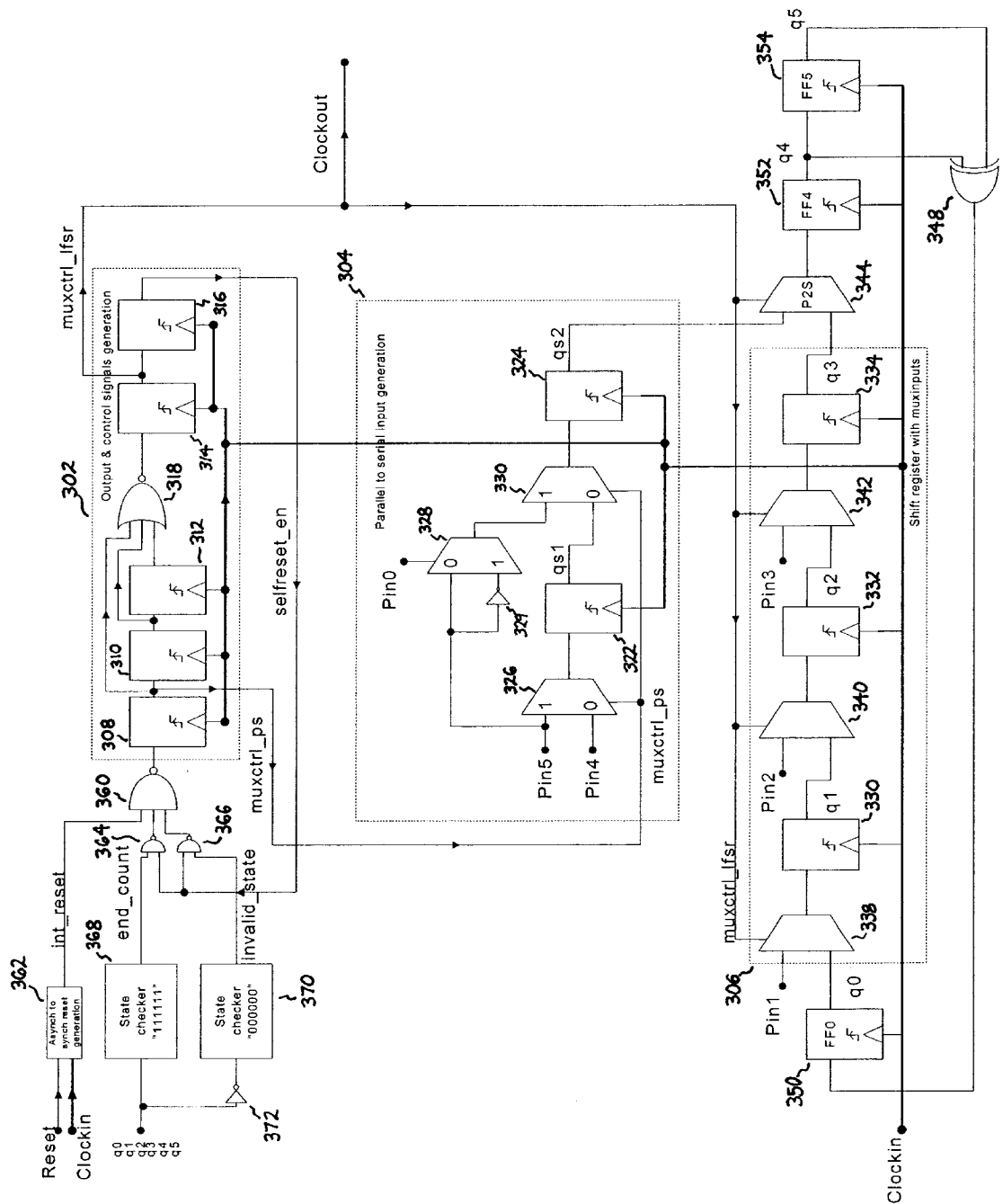
FIG. 3 illustrates an example six-bit frequency divider.

An example of a six-bit frequency divider in accordance with the principles of the invention is illustrated in FIG. 3. The six-bit frequency divider shown in FIG. 3 includes an output-and-control-signals generation circuit 302, a parallel-to-serial-input generation circuit 304, and a shift register 306 with multiplexed inputs. The output-and-control-signals generation circuit 302 includes five flip-flops (308, 310, 312, 314, 316) and a NOR gate 318. The flip-flop 316 is coupled to the output of flip-flop 314. The flip-flop 314 is coupled to the output of NOR gate 318. The NOR gate 318 has three inputs. The flip-flop 308, the flip-flop 310, and the flip-flop 312 are coupled to the three inputs of the NOR gate 318. The parallel-to-serial-input generation circuit 304 includes two flip-flops (322, 324) and three multiplexers (326, 328, 330). One of the inputs to the multiplexer 328 within the parallel-to-serial input generation circuit 304 is coupled to an inverter 329. The output of multiplexer 330 is coupled to the input of the flip-flop 324. The output of multiplexer 328 is coupled to an input of multiplexer 330. The output of flip-flop 322, qs1, is coupled to an input of multiplexer 330. The output of multiplexer 326 is coupled to the input of flip-flop 322.

The shift register 306 with multiplexed inputs includes a flip-flop 330 with output q1, a flip-flop 332 with output q2, and a flip-flop 334 with output q3. A multiplexer 338 with input pin Pin1 and input q0 is coupled to the flip-flop 330. A multiplexer 340 with input pin Pin2 and input q1 is coupled to the flip-flop 330 and the flip-flop 332. A multiplexer 342 with input pin Pin3 and input q2 is coupled to the flip-flop 332 and the flip-flop 334. A multiplexer P2S (344) receives an input qs2 that is output from the parallel-to-serial input generation circuit and an input q3 that is output from the shift register 306. The multiplexer P2S (344) is coupled to the flip-flop 334 within the shift register 306 and flip-flop FF4 (352).

An XOR gate 348 is coupled to a flip-flop FF0 (350) having output q0, to flip-flop FF4 (352), and to flip-flop FF5 (354). The XOR gate 348 has two inputs. The input q4 from the flip-flop FF4 (352) is coupled to one of the inputs of the XOR gate 348. The output qS from the flip-flop FF5 (354) is coupled to the other one of the inputs of the XOR gate 348. The flip-flop FF0 (350) outputs state q0 which is coupled to an input of multiplexer 338 within shift register 306. Flip-flop FF4 (352) and flip-flop FF5 (354) are coupled between the multiplexer P2S (344) and the XOR gate 348 in the feedback loop.

A NAND gate 360 has three inputs and an output. The output of the NAND gate 360 is coupled to the input of the flip-flop 308 within the output-and-control-signals generation circuit 302. An asynchronous-to-synchronous-reset generation circuit 362 is coupled to one of the inputs of the NAND gate 360. A NAND gate 364 is coupled to one of the inputs of the NAND gate 360. A NAND gate 366 is coupled to one of the inputs of the NAND gate 360. Each of NAND gate 364 and NAND gate 366 has two inputs. A first state checker 368 is coupled to an input of the NAND gate 364. A second state checker 370 is coupled to an input of the NAND gate 366. A signal selfreset_en is coupled to an input of NAND gate 364 and an input of NAND gate 366. The states being input to the second state checker 370 are inverted by inverters 372.

The entire counting sequence has two distinct phases: a normal counting phase and a loading counting phase. The normal counting phase is the normal counting mode. The loading phase is performed during the initialization and self-reset time. The duration of the loading phase is five input clock cycles.

With respect to FIG. 3, a fast input clock is input to the frequency divider on the input pin Clockin; and six programming bits (or n programming bits in the generic n-bit counter illustrated in FIG. 2) are input on the input pins Pin0, Pin1, Pin2, Pin3, Pin4 and Pin5. The frequency divider operates to divide the input clock, and produces an output clock on the output pin Clockout.

The shift register 306 with multiplexed inputs includes three (i.e., n–3, where n equals six) multiplexers and flip-flop structures: multiplexer 338 and flip-flop 330; multiplexer 340 and flip-flop 332; and multiplexer 342 and flip-flop 334. The n–3 flip-flops (330, 332, 334) and the flip-flops $FF_0$, $FF_4$, and $FF_5$ (which correspond to the flip-flops $FF_0$, $FF_{n-2}$, $FF_{n-1}$ in the generic n-bit counter illustrated in FIG. 2) allow a count sequence length of $2^n-1$, which for n equals six, is sixty-three. The multiplexers within shift register 306 (338, 340, 342) and multiplexer P2S (344) are used to select the input of each flip-flop. During the normal counting phase, the data is taken from the previous flip-flop. During the loading phase, the data is loaded from the input pins Pin1, Pin2, Pin3, Pin4 and Pin5, as depicted by the waveforms illustrated in FIG. 4.

The parallel-to-serial-input generation circuit 304 sets the q0, q4 and q5 initial states (which correspond to q0, qn–2 and qn–1 in the n-bit counter illustrated in FIG. 2). Such implementation provides very short delay (from one XOR gate 348) in the feedback path of the shift register 306, thus allowing high frequency operation.

The output-and-control-signal generation circuit 302 generates the control signals (muxctrl_lfsr and muxctrl_ps) for the multiplexers. The output signal on the output pin Clockout is obtained from the control signal muxctrl_lfsr. The multiplexers in the shift register 306 perform loading of the parallel input data, and are controlled by the control signal muxctrl_lfsr. The multiplexers in the parallel-to-serial-input generation circuit 304 perform the parallel-to-serial-input data, and are controlled by the control signal muxctrl_ps.

The control signal muxctrl_lfsr lasts three clock cycles to allow the data coming from the parallel-to-serial-input generator circuit 304 to propagate through multiplexer P2S (344) to the flip-flops $FF_0$, $FF_4$ and $FF_5$ in FIG. 3 (which correspond to the flip-flops $FF_0$, $FF_{n-2}$, $FF_{n-1}$ in the n-bit counter illustrated in FIG. 2). The signal muxctrl_ps only samples the input data once. The signal selfreset_en disables the state checkers 368, 370 during the initialization period of the loading phase.

Figure 5:
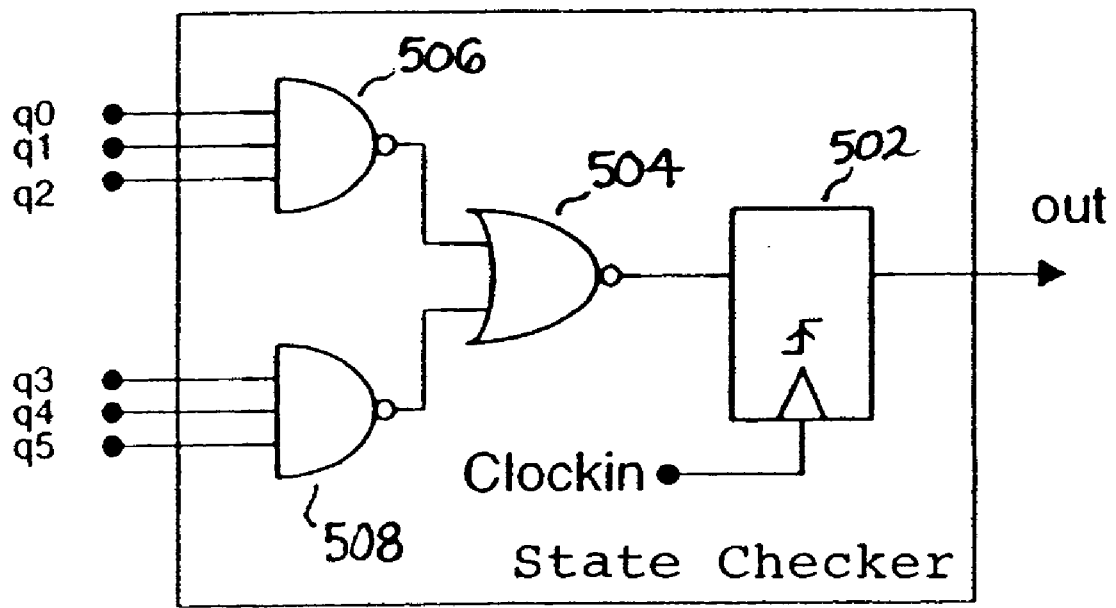
FIG. 5 illustrates a state checker like that depicted in FIG. 3.

The first state checker 368 checks that all the internal states (q0 to qn–1) have reached the value 111111. FIG. 5 illustrates a state checker like that depicted in FIG. 3. The state checker shown in FIG. 5 includes a flip-flop 502, a NOR gate 504, and two NAND gates 506, 508. Flip-flop 502 is included in order to divide the critical path into two clock cycles. The flip-flop 502 receives the input pin Clockin and the output of NOR gate 504. The NOR gate 504 has two inputs. The output of NAND gate 506 is coupled to an input of NOR gate 504. The output of NAND gate 508 is coupled to an input of NOR gate 504.

The internal states (q0 to q5) are input to the first state checker 368. With reference to FIG. 5, states q0, q1, q2 are input to NAND gate 506; and states q3, q4, q5 are input to NAND gate 508.

Referring to FIG. 3, all the internal states (q0 to q5) are inverted by six inverters 372 and input to the second state checker 370.

The asynchronous-to-synchronous-reset generation circuit 362 generates the internal synchronous reset from an external asynchronous reset. The frequency divider illustrated in FIG. 3 is able to start working without the need of a reset. A reset signal applied to the asynchronous-to-synchronous-reset generation circuit 362 via the input pin Reset enables the counter to initially operate without error at the beginning of the first counting cycle. If no reset signal is applied on the input pin Reset, the first counting cycle may be erroneous. Use of the asynchronous-to-synchronous-reset generation circuit 362 is necessary when the reset signal applied on the input pin Reset is not synchronous with the input clock signal applied on the input pin Clockin.

Figure 6:
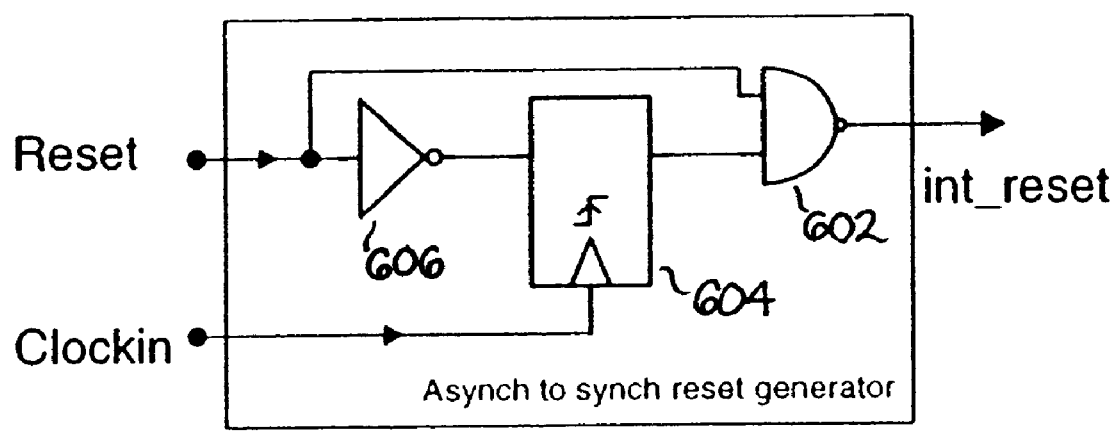
FIG. 6 illustrates an asynchronous-to-synchronous-reset generation circuit like that depicted in FIG. 3.

FIG. 6 illustrates an asynchronous-to-synchronous-reset generation circuit like that shown in FIG. 3. The asynchronous-to-synchronous-reset generator circuit includes a NAND gate 602, a flip-flop 604, and an inverter 606. The NAND gate 602 has two inputs. The input pin Reset is coupled to an input of the NAND gate 602. The output of flip-flop 604 is coupled to an input of NAND gate 602. The input pin Clockin is coupled to flip-flop 604. The output of inverter 606 is coupled to flip-flop 604. The input pin Reset is coupled to the input of inverter 606. The signal int-reset output from the asynchronous-to-synchronous-reset generation circuit 362 has the same waveform and behavior as the signal end_count output from the first state checker 368.

Figure 4:
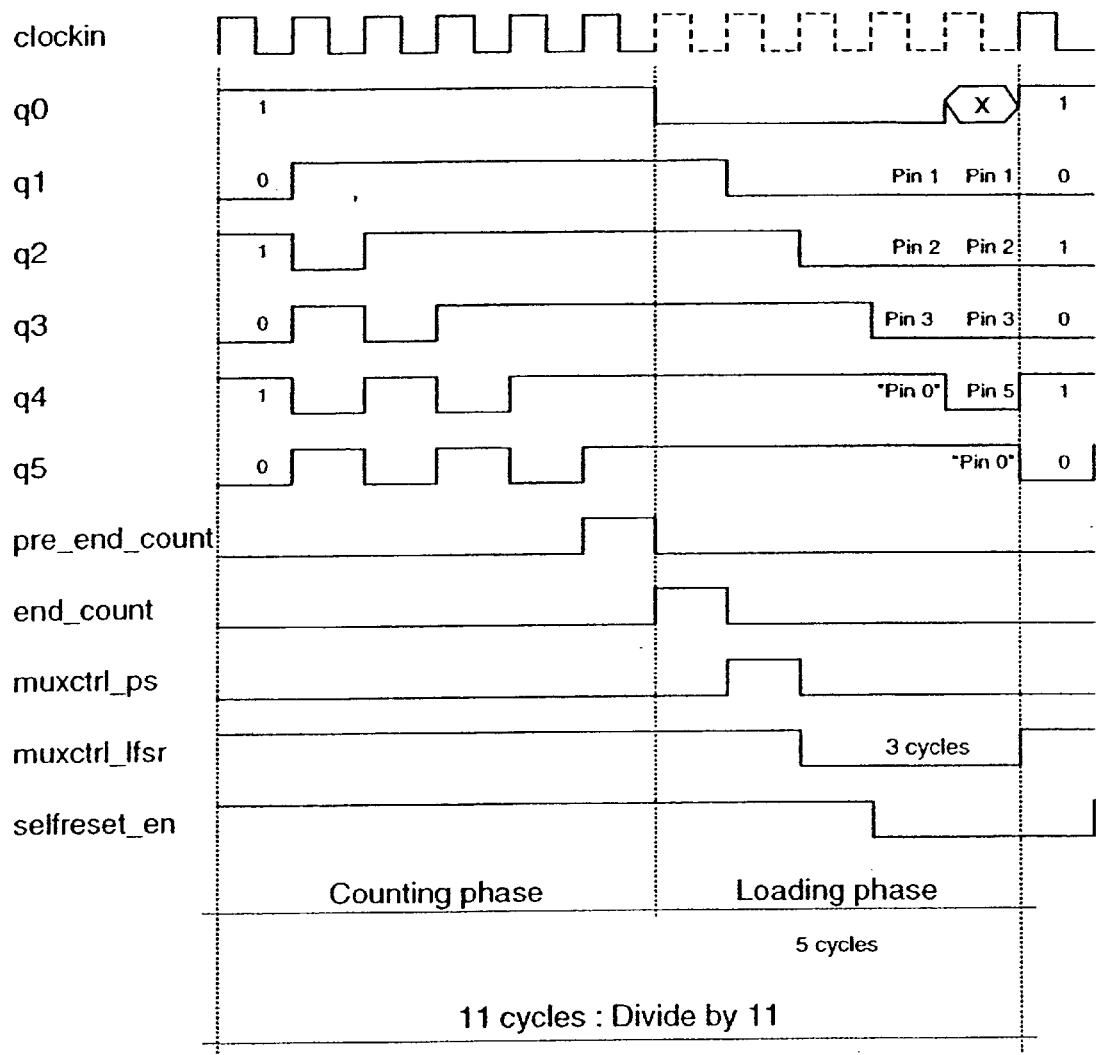
FIG. 4 illustrates a counting example in which a frequency divider is dividing an input clock by eleven.

FIG. 4 shows the waveforms for a counting example, in which the frequency divider/counter is dividing the input clock by eleven (Pin[5:0]="101010"). The process of initialization and self-reset of the frequency divider (in the loading phase) lasts five input clocks. The minimal division (count) will be six (in this case the programming input will be "111111"). Pin i means that during this clock the input is taken through the multiplexer from the input pin number i.

From the foregoing it will be appreciated that the high-frequency functionality is made possible by the logic structure of the frequency divider taught herein. There are no more than two gate levels between every two flip-flops, the state denoting end-of-counting is known and is detectable using a simple logic.

While several particular forms of the invention have been illustrated and described, it will also be apparent that various modifications can be made without departing from the spirit and scope of the invention.

What is claimed is:

1. An apparatus, comprising:
a signal generation circuit outputting an output clock signal responsive to an input clock signal and a state signal;
a shift register, characterized by having a count-sequence length of $2^n-1$, outputting the state signal responsive to the output clock signal;
a feedback loop coupled to the shift register; and
an exclusive or (XOR) gate within the feedback loop.

2. The apparatus of claim 1, further comprising:
a multiplexer within the feedback loop.

3. The apparatus of claim 2, further comprising:
a plurality of flip-flops coupled to the multiplexer within the feedback loop.

4. The apparatus of claim 3, wherein:
the signal generation circuit outputting a control signal responsive to the input clock signal and the state signal.

5. The apparatus of claim 4, further comprising:
a parallel-to-serial-input generation circuit, coupled to the signal generation circuit and to the shift register, and receiving the control signal.

6. The apparatus of claim 5, wherein:
the multiplexer having a first input and a second input, wherein the first input is coupled to the shift register and the second input is coupled to the parallel-to-serial-input generation circuit.

7. A method, comprising:
dividing an input clock signal using a shift register that has a count-sequence length of $2^n-1$ and a feedback loop that includes an exclusive or (XOR) gate;
outputting a state signal from the shift register responsive to an output clock signal; and
outputting the output clock signal based on the input clock signal and the state signal.

8. The method of claim 7, further comprising:
producing a control signal based on the input clock signal and the state signal.

9. The method of claim 8, further comprising:
providing a parallel-to-serial-input generation circuit, wherein the parallel-to-serial-input generation circuit receiving the control signal and outputting a data signal.

10. The method of claim 9, wherein:
the feedback loop includes a multiplexer, wherein the multiplexer having a first input and a second input, wherein the first input is coupled to the shift register and the second input is coupled to the parallel-to-serial-input generation circuit.

11. The method of claim 10, wherein:
the feedback loop includes a plurality of flip-flops.

12. The method of claim 11, further comprising:
operating the plurality of flip-flops with the input clock signal.

13. A computer readable medium having stored thereon instructions which, when executed by a processor, cause the processor to perform a method, said method comprising:
dividing an input clock signal using a shift register that has a count-sequence length of $2^n-1$ and a feedback loop that includes an exclusive or (XOR) gate;
outputting a state signal from the shift register responsive to an output clock signal; and
outputting the output clock signal based on the input clock signal and the state signal.

14. The computer readable medium of claim 13, said method further comprising:
producing a control signal based on the input clock signal and the state signal.

15. The computer readable medium of claim 14, said method further comprising:
providing a parallel-to-serial-input generation circuit, wherein the parallel-to-serial-input generation circuit receiving the control signal and outputting a data signal.

16. The computer readable medium of claim 15, wherein:
the feedback loop includes a multiplexer, wherein the multiplexer having a first input and a second input, wherein the first input is coupled to the shift register and the second input is coupled to the parallel-to-serial-input generation circuit.

17. The computer readable medium of claim 16, wherein:
the feedback loop includes a plurality of flip-flops.

18. The computer readable medium of claim 17, said method further comprising:
operating the plurality of flip-flops with the input clock signal.

* * * * *